US005517195A

United States Patent [19]

Narlow et al.

[11] Patent Number: 5,517,195

[45] Date of Patent: May 14, 1996

[54] DUAL FREQUENCY EAS TAG WITH DEACTIVATION COIL

[75] Inventors: Douglas A. Narlow, Coral Springs; Hubert A. Patterson, Boca Raton, both of Fla.

[73] Assignee: Sensormatic Electronics Corporation, Deerfield Beach, Fla.

[21] Appl. No.: 306,152

[22] Filed: Sep. 14, 1994

[51] Int. Cl.$^{6}$ .................................................... H03M 7/34

[52] U.S. Cl. ............................................. 342/51; 340/572

[58] Field of Search ................................ 342/51; 340/572

[56] References Cited

U.S. PATENT DOCUMENTS

| | | | |
|---|---|---|---|
| 3,631,442 | 12/1971 | Fearon | 340/258 R |
| 4,021,705 | 5/1977 | Lichtblau | 361/402 |
| 4,063,229 | 12/1977 | Welsh et al. | 340/280 |
| 4,318,090 | 3/1982 | Narlow et al. | 340/572 |
| 4,567,473 | 1/1986 | Lichtblau | 340/572 |
| 4,663,625 | 5/1987 | Yewen | 340/825.54 |
| 4,736,207 | 4/1988 | Siikarla et al. | 343/895 |
| 4,745,401 | 5/1988 | Montean | 340/572 |
| 5,103,210 | 4/1992 | Rode et al. | 340/572 |
| 5,257,009 | 10/1993 | Narlow | 340/572 |

*Primary Examiner*—J. Woodrow Eldred
*Attorney, Agent, or Firm*—Robin, Blecker, Daley & Driscoll

[57] ABSTRACT

A dual frequency microwave EAS tag includes a dual frequency antenna circuit formed on one side of a substrate. The antenna circuit includes a diode. A deactivation circuit is formed on the other side of the substrate. A conductive connection passes through a hole in the substrate and connects the deactivation circuit to the antenna circuit. The deactivation circuit responds to a low energy ac magnetic field by inducing a voltage in the diode of the antenna circuit so as to disable the diode, thereby deactivating the tag without requiring the tag to be placed in direct contact with a disabling device.

27 Claims, 4 Drawing Sheets

DUAL FREQUENCY EAS TAG WITH DEACTIVATION COIL

FIELD OF THE INVENTION

This invention relates generally to tag devices for use in electronic article surveillance systems and pertains more particularly to the provision in such tag devices of circuitry for selectively disabling the tag device.

BACKGROUND OF THE INVENTION

It is known to provide an electronic article surveillance (EAS) tag device which is responsive to both a first frequency, which is in the microwave range, and a second, lower frequency. Such a tag device is disclosed in U.S. Pat. No. 4,736,207, issued to Siikarla et. al. and commonly assigned with the present application. The disclosure of that U.S. Pat. No. 4,736,207 is incorporated herein by reference.

The tag device described in the '207 patent includes in compact form an antenna which is tuned to receive the first and second frequencies. The tag is used with detecting equipment that emits signals at the first and second frequencies, and in the presence of such signals the tag device receives the two signals via the antenna, and in effect mixes the two signals to provide a signal at the first frequency modulated by the second frequency. The tag reradiates the mixed signal, and the reradiated signal is received by the detecting equipment to detect the presence of the tag device.

As disclosed in the above-referenced Siikarla et al. patent, the conventional tag includes a thin, rectangular and planar substrate made of an insulative material. A conductive layer is formed on one surface of the substrate in a predetermined pattern so as to provide most of the circuit elements required for the desired dual-frequency antenna. The antenna is completed by means of a diode mounted so as to connect two portions of the conductive layer. Siikarla et al. also teach that an additional insulative layer is overlaid on the conductive antenna layer, while leaving access to the conductive layer so that the tag may be deactivated by applying an energy pulse to destroy the diode.

Although dual-frequency tags have proved quite useful for their intended purposes, it would be advantageous if deactivation of such tags could be performed without directly coupling the tag to a source of an electrical pulse. U.S. Pat. No. 5,257,009, issued to Narlow (which has an assignee and an inventor in common with this application) discloses a dual-frequency tag that can be deactivated by exposing the tag to an electrostatic field which changes the capacitance of a variable capacitor that is associated with the tag's antenna circuit. It would be desirable to provide a field-deactivatable dual-frequency tag that is easier to manufacture than the tag disclosed in the '009 patent.

OBJECTS AND SUMMARY OF THE INVENTION

It is accordingly an object of the invention to provide a dual frequency EAS tag which can be deactivated without direct coupling to a deactivation device. It is a more particular object of the invention to provide such a tag which can be deactivated by exposure to a suitable electromagnetic field. It is a further object to provide such a tag which is easy to manufacture.

In attaining the foregoing and other objects, the invention provides a tag device for use in an electronic article surveillance system, including an insulative substrate having first and second planar sides, an antenna circuit formed on the first planar side of the insulative substrate and including a first circuit element which exhibits voltage dependent capacitive reactance, a deactivation circuit formed on the second planar side of the insulative substrate, and means for conductively connecting the deactivation circuit to the antenna circuit, the deactivation circuit being for responding to a deactivation field applied to the tag device and, in response to the field, inducing in the first circuit element a voltage of sufficient magnitude to permanently and substantially change an operating characteristic of the first circuit element.

According to further aspects of the invention, the deactivation circuit includes an inductor, and the structure for connecting the deactivation circuit to the antenna circuit includes a conductive material which passes through a hole in the substrate.

According to still another aspect of the invention, the antenna circuit is for receiving and concurrently reradiating a first high frequency signal and a second lower frequency signal transmitted by the surveillance system. According to yet another aspect of the invention, the antenna circuit includes second and third circuit elements connected to form a series circuit with the first circuit element, with the second and third circuit elements being mutually separate and of respective different geometries for predominant receipt respectively of the first and second frequency transmitted signals.

According to still further aspects of the invention, the first circuit element is a silicon diode and the deactivation circuit responds to the deactivation field by permanently open-circuiting or short-circuiting the silicon diode.

The foregoing and other objects and features of the invention will be further understood from the following detailed description of preferred embodiments and from the drawings, wherein like reference numerals identify like components and parts throughout.

DETAILED DESCRIPTION OF PREFERRED EMBODIMENTS

Figure 1:
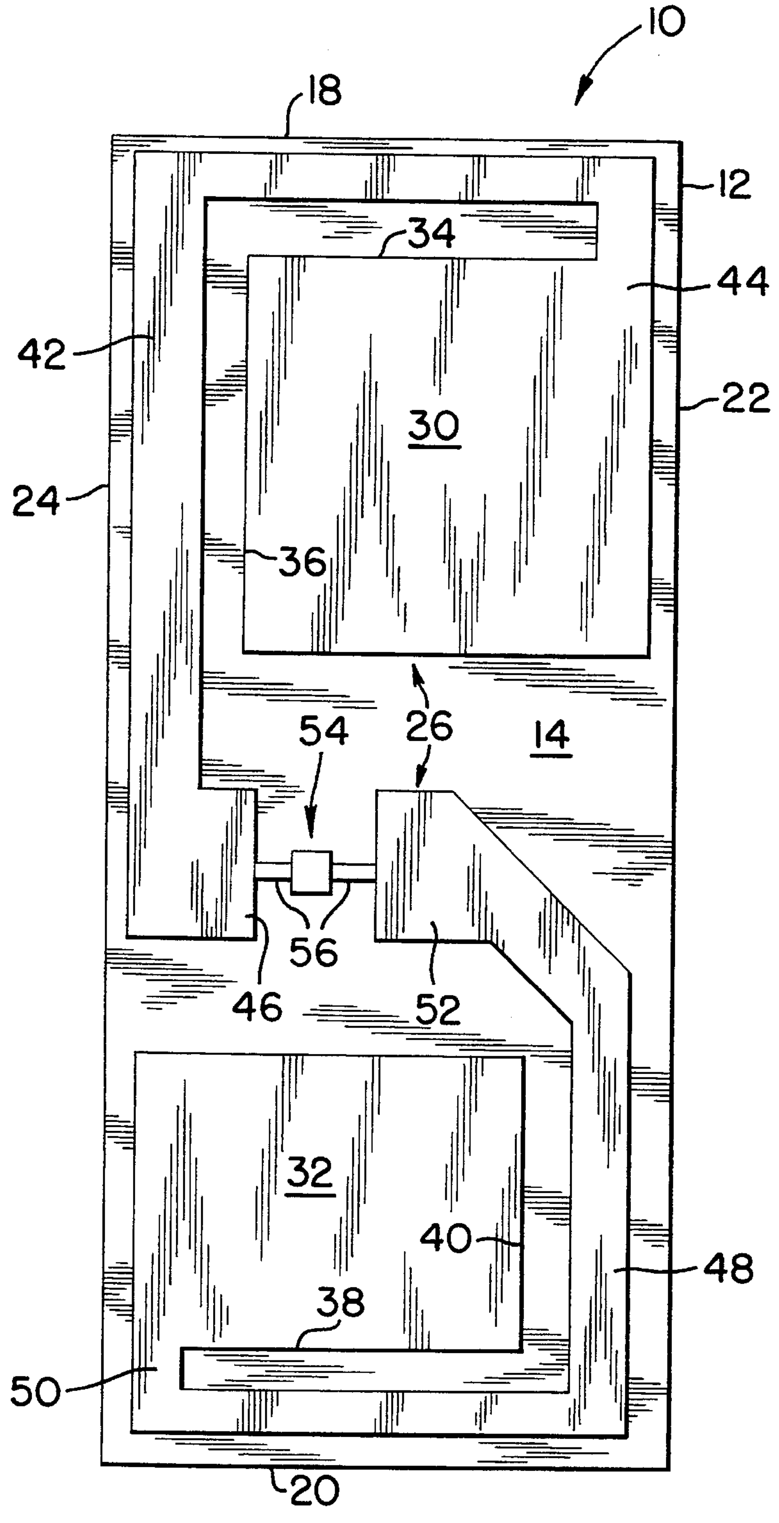
FIG. 1 is a top plan view of an embodiment of a tag device in accordance with the invention.

Referring to FIGS. 1–6, a tag device 10 in accordance with the invention includes an electrically insulative substrate 12, which is generally planar and rectangular. The substrate 12 has a first planar side 14 (best seen in FIG. 1) and a second planar side 16 (best seen in FIG. 2). The sides 14 and 16 of the substrate 12 are substantially parallel to, and opposite, each other. The substrate 12 also has transverse edges 18 and 20, which extend in parallel to each other and in a transverse direction of the substrate, and longitudinal edges 22 and 24 which extend in parallel to each other in a longitudinal direction of the substrate. A conductive layer 26 is formed on the side 14 of the substrate and another conductive layer 28 is formed on the opposite side 16 of the substrate.

The conductive layer 26 includes a transverse portion 30 displaced towards the edge 18 of the substrate 12, and a second transverse portion 32 displaced toward the edge 20 of the substrate 12. Each of the transverse portions 30 and 32 is more than half as wide as the substrate 18 and each is about as long as it is wide.

The transverse portion 30 has a transverse border 34 which is parallel to and faces the transverse edge 18 of the substrate 12 and a longitudinal border 36 which is parallel to and faces the longitudinal edge 24 of the substrate 12. Also, the transverse portion 32 has a transverse border 38 which is parallel to and faces the transverse edge 20 of the substrate 12 and a longitudinal border 40 that is parallel to and faces the longitudinal edge 22 of the substrate 12.

The conductive layer 26 also includes a conductive course 42 which emerges at 44 from the transverse portion 30 adjacent the border 34 of the transverse portion 30 and extends continuously between the edge 18 of the substrate 12 and the border 34 and also between the edge 24 of the substrate 12 and the border 36 of the transverse portion 30. The course 42 terminates with a transverse wing 46 at a central part of the substrate 12.

The conductive layer 26 further includes a conductive course 48 which emerges at 50 from the transverse portion 32 adjacent the transverse border 38 of the transverse portion 32 and extends continuously between the edge 20 of the substrate 12 and the border 38, and also between the edge 22 of the substrate 12 and the longitudinal border 40 of the transverse portion 32. The course 48 terminates with a transverse wing 52 formed to oppose the transverse wing 46 at the central part of the substrate 12. A diode 54 is connected via leads 56 between the transverse wings 46 and 52. The diode 54 may be, for example, a standard PN junction type diode or a PIN junction type diode.

Figure 2:
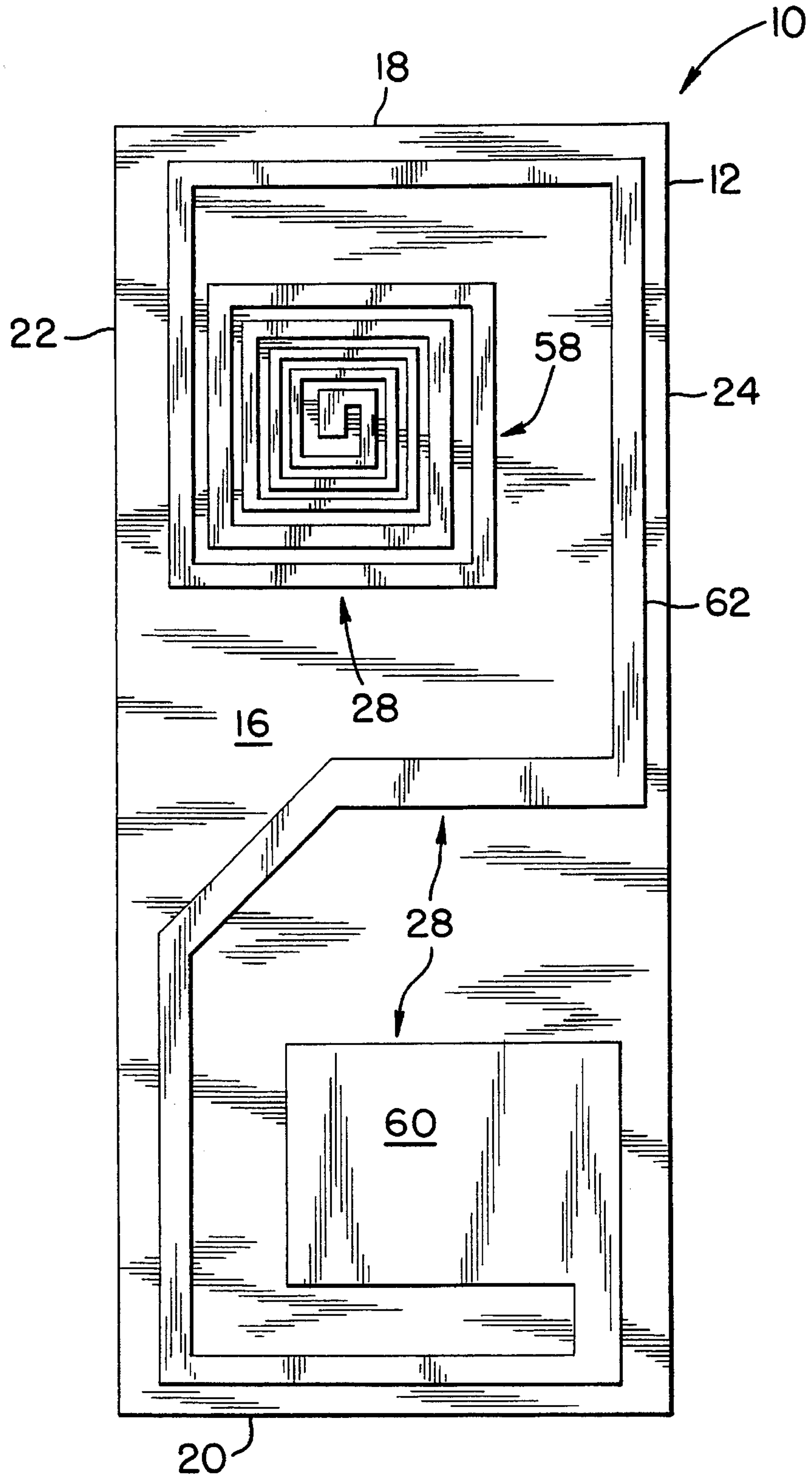
FIG. 2 is a bottom plan view of the tag device of FIG. 1.

The conductive layer 28, as best seen in FIG. 2, includes a coil 58 formed as a spiral conductive course on the side 16 of substrate 12 and displaced toward the transverse edge 18 of the substrate 12. The layer 28 also includes a plate portion 60 which is displaced toward the edge 20 of the substrate 12. The conductive layer 28 also includes a generally S-shaped conductive course 62 which connects the plate portion 60 and the coil 58.

Figure 3:
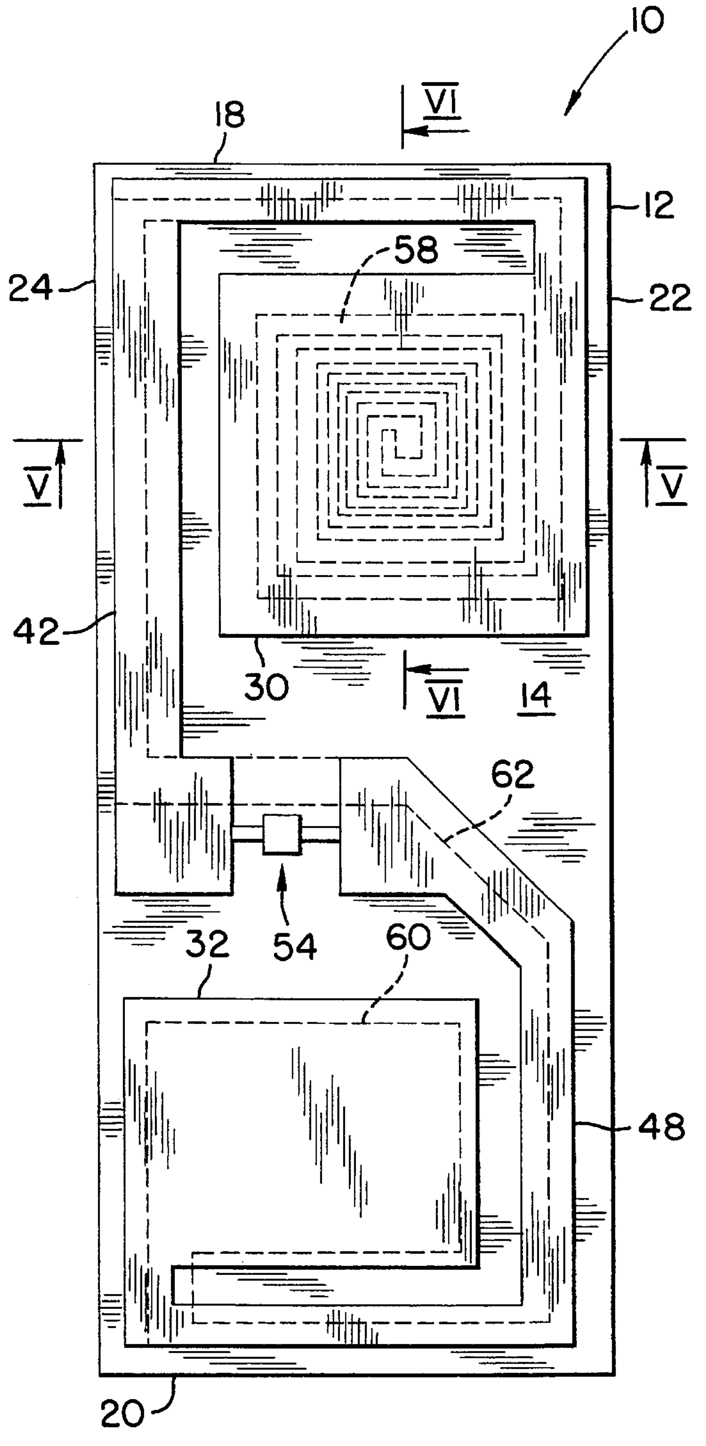
FIG. 3 is a top plan view similar to FIG. 1, but also showing in phantom elements shown in FIG. 2.
Figure 4:
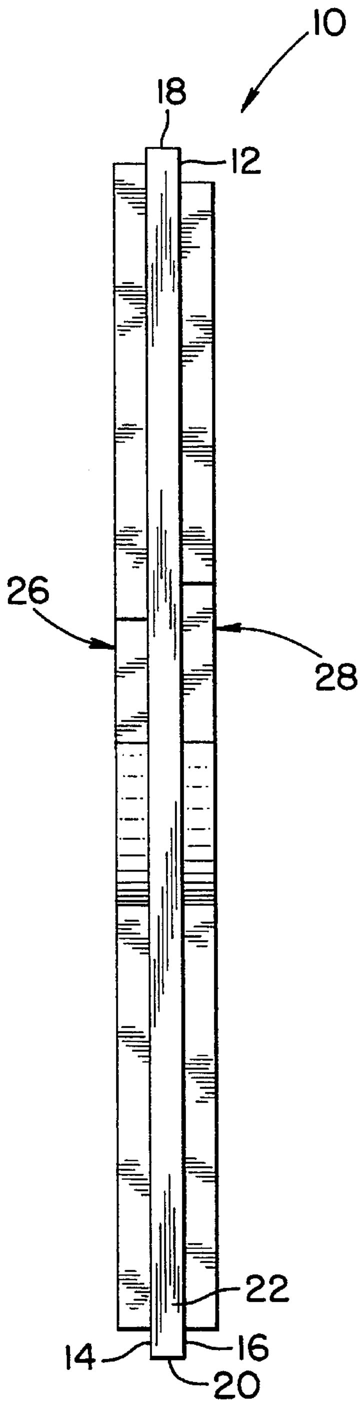
FIG. 4 is a right side elevation view of the tag device of FIG. 1.
Figure 5:
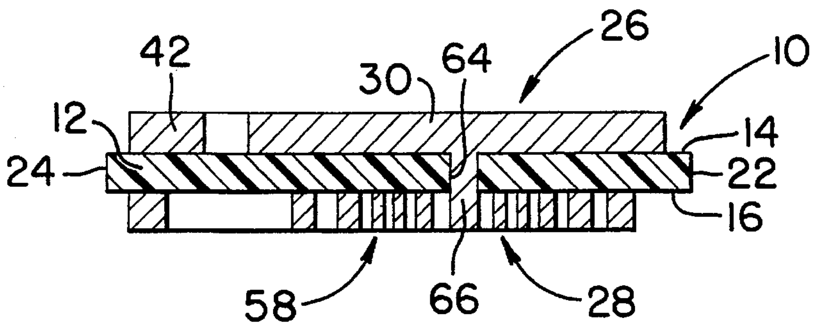
FIG. 5 is a sectional view as would be seen from plane V—V of FIG. 3.
Figure 6:
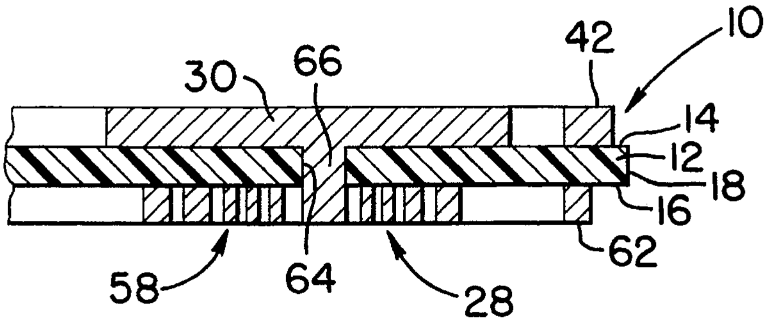
FIG. 6 is a sectional view as would be seen from plane VI—VI of FIG. 3.

The positional relationship between the conductive layers 26 and 28 can best be appreciated by reference to FIG. 3, which shows the features of the conductive layer 26 as shown in FIG. 1, and which also shows in phantom and somewhat schematically the features of the conductive layer 28 (shown in FIG. 2). The plate portion 60 of the conductive layer 28 is positioned relative to the transverse portion 32 of the conductive layer 26 so as to form a capacitor with the transverse portion 32. Although the somewhat schematic showing of FIG. 3 suggests that the plate portion 60 is slightly smaller than the transverse portion 32, nevertheless, according to a preferred embodiment of the invention, the size (length and width), shape and position of the plate portion 60 correspond to the size (length and width), shape and position of the transverse portion.

It will be seen from FIG. 3 that the position of coil 58 on side 16 of substrate 12 corresponds to the position of transverse portion 30 on side 14 of substrate 12. Moreover, a through hole 64 (FIGS. 5 and 6) is formed in the substrate 12 at a central part of the transverse portion 30 of the conductive layer 26. A conductive material 66 is formed within the through hole 64 and passes therethrough to provide a conductive connection between the coil 58 and transverse portion 30. Thus the conductive material 66 forms a conductive connection between the conductive layers 26 and 28. It will be recognized that the conductive material 66 passes through the hole 64 from side 14 to side 16 of the substrate 12.

It will also be recognized from FIG. 3 that the S-shaped course 62 follows a path on the side 16 of substrate 12 which corresponds to a path defined on the side 14 of substrate 12 by the courses 42 and 48 of the conductive layer 26 and the diode connected between the respective transverse wings 46 and 52 of the courses 42 and 48.

As will be understood from the disclosure of the aforesaid U.S. Pat. No. 4,736,207, the conductive layer 26 and the diode 54 form an antenna circuit which provides receipt of and concurrent response to a first high frequency signal and a second lower frequency signal such as are transmitted by an EAS system which uses the type of tag disclosed in the '207 patent. Moreover, the diode 54 is an element in the antenna circuit which exhibits voltage dependent capacitive reactance. As is understood by those skilled in the art, the antenna formed on side 14 of the substrate 12 responds to a dual frequency interrogation signal from the EAS system by electrostatically couplings the low frequency signal to modulate the higher frequency signal, thereby generating a distinctive signal that is detected by the EAS system.

On the other hand, the conductive layer 28 formed on the side 16 of the substrate 12 is formed as a deactivation circuit. This deactivation circuit, upon exposure to a relatively low energy alternating magnetic field at an appropriate frequency, induces a sufficiently high voltage in the diode 54 to permanently short-circuit, open-circuit or otherwise change a characteristic of, the diode 54. As a result, the antenna circuit, and therefore the tag device 10, is permanently disabled, and no longer provides the distinctive signal in response to the interrogation signal from the EAS system.

Preferably, the plate portion 60 of the conductive layer 28 is sized and shaped so that the capacitor formed by the plate portion 60 and the transverse portion 32 of the conductive circuit 26 has a value in the range of 20–100 pF. Meanwhile, the coil 48 forms an inductor having a value that is preferably in a range of 1–4 μH. The frequency of the required deactivation field can be calculated according to the formula:

$$F=1/(2_{\pi}(LC)^{1/2})$$

Such a deactivation field may be provided by equipment of the type currently used to provide magnetic deactivation fields for EAS tags, modified to generate a field at the frequency calculated as above.

Although not shown in the drawings, it should be understood that a respective insulative layer is formed over each of the conductive layers 26 and 28 to protect the conductive layers from damage by physical contact and so forth. These insulative layers may cover all of the sides of the tag device 10, as there is no need to leave contact points for direct application of a disabling energy pulse.

Figure 7:
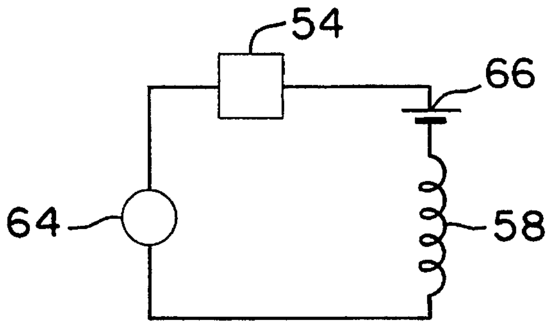
FIGS. 7 shows an equivalent circuit to the tag device of the invention in response to receipt of a deactivation field signal.

FIG. 7 shows an equivalent circuit to the tag device 10 generally in response to receipt of the deactivation field, which is represented as a voltage source 64. Reference numeral 66 represents a capacitance which is in series with the inductance 58, and which is provided by the transverse portion 32 of the conductive layer 26 and the plate portion 60 of the conductive layer 28. Thus the inductance 58 and the capacitance 68 together represent the deactivation circuit provided by the conductive layer 28 for deactivating the diode 54.

Provision of a deactivation circuit in a dual frequency microwave EAS tag in accordance with the invention permits the tag to be deactivated without placing the tag in contact with a deactivation device. As a result, deactivation may be performed more quickly and conveniently than in the case of conventional dual frequency microwave tags. In addition, the deactivation field can be provided at relatively low energy, so that the deactivation equipment can be used safely without high cost enclosures and safety locks.

Various changes to the foregoing tag device may be introduced without departing from the invention. For example, instead of providing the courses 42 and 48 adjacent opposite longitudinal sides 22 and 24 of the substrate 12 as shown in FIG. 1 hereof, the conductive layer constituting the antenna circuit may be arranged so that both of the courses are adjacent the same longitudinal side of the substrate, as shown in FIG. 10 of the aforesaid '207 patent.

The particularly preferred apparatus is thus intended in an illustrative and not limiting sense. The true spirit and scope of the invention is set forth in the following claims.

What is claimed is:

1. A tag device for use in an electronic article surveillance system, comprising:

an insulative substrate having first and second planar sides;

an antenna circuit formed on the first planar side of said insulative substrate and including a first circuit element which exhibits voltage dependent capacitive reactance, said first circuit element being provided entirely on the first planar side of said insulative substrate;

a deactivation circuit formed on the second planar side of said insulative substrate; and means for conductively connecting said deactivation circuit to said antenna circuit;

said deactivation circuit being for responding to a deactivation field applied to said tag device and for inducing in said first circuit element, in response to said deactivation field, a voltage of sufficient magnitude to permanently and substantially change an operating characteristic of said first circuit element.

2. A tag device according to claim 1, wherein said deactivation circuit includes an inductor.

3. A tag device according to claim 1, wherein said means for connecting includes a conductive material which passes through a hole in said substrate.

4. A tag device according to claim 1, wherein said antenna circuit is for receiving and concurrently reradiating a first high frequency signal and a second lower frequency signal transmitted by the surveillance system.

5. A tag device according to claim 4, wherein said antenna circuit includes second and third circuit elements connected to form a series circuit with said first circuit element, said second and third circuit elements being mutually separate and of respective different geometries for predominant receipt respectively of said first and second frequency transmitted signals.

6. A tag device according to claim 5, wherein said first circuit element is a silicon diode.

7. A tag device according to claim 6, wherein said deactivation circuit responds to said deactivation field by permanently open-circuiting said silicon diode.

8. A tag device according to claim 6, wherein said deactivation circuit responds to said deactivation field by permanently short-circuiting said silicon diode.

9. In a tag device to be used in an electronic article surveillance system for receipt of and concurrent response to a first high frequency signal and a second lower frequency signal transmitted by such system, said tag device comprising an antenna circuit for receiving and concurrently reradiating said first and second frequency transmitted signals, said antenna circuit comprising reactance means for exhibiting voltage dependent capacitive reactance, the improvement comprising deactivation means for responding to a deactivation field applied to said tag device and for inducing in said reactance means, in response to said deactivation field, a voltage of sufficient magnitude to permanently and substantially change an operating characteristic of said reactance means.

10. The invention claimed in claim 9, wherein said deactivation means includes an inductor and a capacitor.

11. The invention claimed in claim 10, wherein said antenna circuit includes a first circuit element dimensioned to receive predominantly said first frequency signal and a second circuit element dimensioned to receive predominantly said second frequency signal, and said inductor is connected to said second circuit element.

12. The invention claimed in claim 9, wherein said reactance means comprises a silicon diode.

13. The invention claimed in claim 12, wherein said deactivation means responds to said deactivation field by permanently open-circuiting said silicon diode.

14. The invention claimed in claim 12, wherein said deactivation means responds to said deactivation field by permanently short-circuiting said silicon diode.

15. The invention claimed in claim 9, wherein said tag device includes a substantially planar insulative substrate, said antenna circuit is formed at least in part by a first conductive layer on one side of said substrate, and said deactivation means is formed at least in part by a second conductive layer on another side of said substrate; and further comprising connection means for conductively connecting said first and second conductive layers.

16. The invention as claimed in claim 15, wherein said connection means is formed of a conductive material which passes through said substrate from said one side to said other side of said substrate.

17. A tag device for use in an electronic article surveillance system, comprising:

(a) a generally planar and rectangular insulative substrate having a first planar side, a second planar side parallel and opposite to said first planar side, first and second transverse edges extending in parallel transversely of said substrate, and first and second longitudinal edges extending in parallel longitudinally of said substrate, said substrate having a width in a transverse direction of said substrate;

(b) a first conductive layer formed on said first planar side of said substrate and including:

(b1) a first transverse portion displaced toward said first transverse edge of said substrate, and having a width in said transverse direction of said substrate that is at least half as wide as said width of said substrate, and having a length in a longitudinal direction of said substrate that is substantially as long as said width of said first transverse portion, said first transverse portion also having a transverse border parallel to and facing said first transverse edge of said substrate and a longitudinal border parallel to and facing said first longitudinal edge of said substrate, (b2) a second transverse portion displaced toward said second transverse edge of said substrate and having a width in said transverse direction of said substrate that is substantially the same as said width of said first transverse portion and a length substantially as long as said length of said first transverse portion, said second transverse portion also having a transverse border parallel to and facing said second transverse edge of said substrate and a longitudinal border parallel to and facing an adjacent one of said first and second longitudinal edges of said substrate, (b3) a first course emerging from said first transverse portion at said transverse border of said first transverse portion and extending continuously between said first transverse edge of said substrate and said transverse border of said first transverse portion and between said first longitudinal edge of said substrate and said longitudinal border of said first transverse portion, and terminating with a first transverse wing at a central part of said substrate, and (b4) a second course emerging from said second transverse portion at said transverse border of said second transverse portion and extending continuously between said second transverse edge of said substrate and said transverse border of said second transverse portion and between said longitudinal border of said second transverse portion and said adjacent one of said first and second longitudinal edges of said substrate, and terminating with a second transverse wing at said central part of said substrate;

(c) a diode connected between said first and second transverse wings of said first and second courses;

(d) a second conductive layer formed on said second planar side of said substrate and including:

(d1) a coil formed as a spiral course at a position on said second planar side corresponding to a position on said first planar side of said first transverse portion of said first conductive layer, (d2) a plate portion for forming a capacitor with said second transverse portion of said first conductive layer, said plate portion having a length and width corresponding to the length and width of said second transverse portion and being at a position on said second planar side corresponding to a position of said second transverse portion on said first planar side, and (d3) a course for connecting said coil and said plate portion; and (e) a conductive connection passing through a hole in said substrate and connecting said coil to said first transverse portion.

18. A tag device according to claim 17, wherein said longitudinal border of said second transverse portion faces said second longitudinal edge of said substrate.

19. A tag device according to claim 18, wherein said course for connecting said coil and said plate portion follows a path on said second planar side of said substrate which corresponds to a path formed on said first planar side by said first and second courses and said diode.

20. A tag device according to claim 17, wherein said diode is a silicon diode.

21. A tag device for use in an electronic article surveillance system, comprising:

an insulative substrate having first and second planar sides;

an antenna circuit formed on the first planar side of said insulative substrate and including a diode;

a deactivation circuit formed on the second planar side of said insulative substrate; and means for conductively connecting said deactivation circuit to said antenna circuit;

said deactivation circuit being for responding to a deactivation field applied to said tag device and for inducing in said diode, in response to said deactivation field, a voltage of sufficient magnitude to permanently and substantially change an operating characteristic of said diode.

22. A tag device according to claim 21, wherein said deactivation circuit includes an inductor.

23. A tag device according to claim 21, wherein said means for connecting includes a conductive material which passes through a hole in said substrate.

24. A tag device according to claim 21, wherein said antenna circuit is for receiving and concurrently reradiating a first high frequency signal and a second lower frequency signal transmitted by the surveillance system.

25. A tag device according to claim 24, wherein said antenna circuit includes second and third circuit elements connected to form a series circuit with said diode, said second and third circuit elements being mutually separate and of respective different geometries for predominant receipt respectively of said first and second frequency transmitted signals.

26. A tag device according to claim 21, wherein said deactivation circuit responds to said deactivation field by permanently open-circuiting said diode.

27. A tag device according to claim 21, wherein said deactivation circuit responds to said deactivation field by permanently short-circuiting said diode.

* * * * *